US006204506B1

(12) United States Patent
Akahori et al.

(10) Patent No.: US 6,204,506 B1
(45) Date of Patent: Mar. 20, 2001

(54) BACK ILLUMINATED PHOTODETECTOR AND METHOD OF FABRICATING THE SAME

(75) Inventors: Hiroshi Akahori; Masaharu Muramatsu, both of Hamamatsu (JP)

(73) Assignee: Hamamatsu Photonics K.K., Shizuoka-ken (JP)

( * ) Notice: Subject to any disclaimer, the term of this patent is extended or adjusted under 35 U.S.C. 154(b) by 0 days.

(21) Appl. No.: 09/092,014

(22) Filed: Jun. 4, 1998

(30) Foreign Application Priority Data

Jun. 5, 1997 (JP) .................................... 9-147992

(51) Int. Cl.⁷ .................................................. H01L 29/78
(52) U.S. Cl. ................. 250/370.09; 250/363.02; 250/370.11
(58) Field of Search ................... 250/370.09, 370.11, 250/363.02

(56) References Cited

U.S. PATENT DOCUMENTS

| 4,422,091 | 12/1983 | Liu . |
| 4,923,825 | 5/1990 | Blouke et al. . |
| 4,946,716 | 8/1990 | Corrie . |
| 5,343,064 | 8/1994 | Spangler et al. . |
| 5,414,276 | 5/1995 | McCarthy . |

FOREIGN PATENT DOCUMENTS

| 53-114361 | 10/1978 | (JP) . |
| 01094651 | 4/1989 | (JP) . |
| 6-268183 | 9/1994 | (JP) . |
| 6-291291 | 10/1994 | (JP) . |
| 6-93448 | 11/1994 | (JP) . |
| 002077702 | 5/1989 | (TW) . |

OTHER PUBLICATIONS

Huang et al: "A new process for thinned, back–illuminated CCD imager devices" 1989 International Symposium on VLSI Technology, System and Applications. Proceedings of Technical Papers (Cat. No. 89CH2631–0), Taipei, Taiwan, May 17–19, 1989, pp. 98–101, XP002077702 1989, New York, NY, USA, IEEE, USA.

Patent Abstracts of Japan vol. 013, No. 330 (E–793), Jul. 25, 1989 & JP 01 094651 A (NEC Corp), Apr. 13, 1989.

*Primary Examiner*—Constantine Hannaher
*Assistant Examiner*—Andrew Israel
(74) *Attorney, Agent, or Firm*—Pillsbury Madison & Sutro LLP

(57) ABSTRACT

An n-type buried channel, a silicon oxide film, a poly-Si transfer electrode, a PSG film as an insulating interlayer, an aluminum interconnection, and a silicon nitride film are stacked on one surface of a p-type silicon substrate to form a CCD. The other surface is protected by a silicon oxide film, and a p⁺-type accumulation layer is formed on the silicon oxide film, thereby forming a back-illuminated CCD on which light, electromagnetic wave, charged particles, or the like is incident through the other surface. A glass substrate is anodically bonded on the CCD via an insulating polyimide film, and a conductive aluminum film. Therefore, the mechanical strength of the device is kept high, and the sensitivity can be increased by thinning the silicon substrate.

11 Claims, 10 Drawing Sheets

BACK ILLUMINATED PHOTODETECTOR AND METHOD OF FABRICATING THE SAME

BACKGROUND OF THE INVENTION

1. Field of the Invention

The present invention relates to a back-illuminated photodetector such as a back-illuminated charge coupled device (CCD) or back-illuminated active pixel sensor (APS) for detecting a radiation having a large absorption coefficient such as ultraviolet ray, γ-ray, or charged particle beam, and a method of fabricating the same.

2. Related Background Art

As a photodetector for detecting the energy distribution of an electromagnetic wave or light containing charged particles as an image, a CCD is known. The full frame transfer (FFT) CCD is mainly used for measurement purposes.

A general CCD based on the FFT has no storage portions, and individual imaging portions can have a large size. Because of the large photosensitive area, this device prefers for weak light level. However, incident light must reach the imaging portion through a polysilicon electrode or protective PSG film formed on the surface of the device. Since such an element formed on the surface absorbs input light having a large absorption coefficient, e.g., light with a wavelength of 400 nm or less, the light does not reach the imaging portion, so high sensitivity cannot be expected for light in such a short wavelength region.

To detect light with a short wavelength, a back-illuminated CCD can be used as it has an imaging portion with a substrate as thin as about 10 to 30 μm and illuminates from the opposite side of the electrode formation surface. In this back-illuminated CCD, even light having a short wavelength reaches the imaging portion without being largely absorbed, so high sensitivity can be obtained even in a short wavelength band of about 200 nm. The device can also be applied to, e.g., X-ray imaging for medical use.

In the X-ray imaging, an image is difficult to reduce and project on the imaging portion of the CCD, unlike the normal visible light image sensing, and a CCD having an imaging surface with almost the same size as that of the object must be prepared. A CCD to be used for chest X-ray radiography must be a large CCD or a buttable CCDS. However, the back-illuminated CCD with a thin imaging portion is fragile and is difficult to increase its size. For the firm CCD, a thick frame is fitted on the imaging portion. However, even a device of this type can hardly have a large size, and the frame around the imaging portion is dead space.

Techniques for solving this problem are disclosed in Japanese Patent Laid-Open Nos. 53-114361 (to be referred to as "prior art 1" hereinafter), 62-30373 (to be referred to as "prior art 2" hereinafter), 6-268183 (to be referred to as "prior art 3" hereinafter), and 6-291291 (to be referred to as "prior art 4" hereinafter).

In prior art 1, a CCD is bonded on a support substrate via boro-silicate glass (BSG) or boro-phospho-silicate glass (BPSG) softened by heating, and then, a thin imaging portion is formed. This prior art is characterized in that V-shaped grooves are formed in the bonding surfaces of the CCD and the support substrate in advance.

In prior art 2, boro-silicate glass is deposited thick on that surface of a CCD or a substrate having a CCD, which is opposite to the illuminated surface, and is fired to form a reinforcing member.

In prior art 3, a sapphire substrate is anodically bonded on the illuminated surface of a CCD. In prior art 4, a protective insulating film is formed on the device surface side with a CCD and planarized, and then, a glass substrate is anodically bonded on the protective insulating film.

SUMMARY OF THE INVENTION

However, these prior arts have the following problems.

In prior art 1, air is confined in the V-shaped grooves upon bonding. This air expands in the fabrication process to form a void. The silicon substrate may deform to degrade the planarity of the illuminated surface, resulting in a poor uniformity in sensitivity. Sometimes, a chemical solution or the like enters the device through the V-shaped grooves in the process to locally degrade the device, resulting in a poor uniformity in sensitivity.

In prior art 2, when the adhesion strength between the glass layer and the silicon substrate of the CCD is increased, the glass layer may warp. Consequently, the CCD warps and it causes defocus in photographing, resulting in a poor uniformity in image.

In prior art 3, the sapphire substrate anodically bonded on the imaging surface absorbs short-wavelength light, an X-ray, an electron beam, or the like, resulting in a decrease in sensitivity for such short-wavelength light.

Prior art 4 is out of the problem of light absorption by the reinforcing plate because the surface opposite to the illuminated surface is reinforced. However, electrostatic charges are locally generated on the glass substrate as a dielectric, resulting in a poor uniformity in image.

For these reasons, conventionally, a large back-illuminated photodetector for short-wavelength light with a good uniformity in image is difficult to fabricate.

The present invention has been made in consideration of the above problems, and has as its object to provide a back-illuminated photodetector having a sufficient strength and high sensitivity for short-wavelength light, which has a good uniformity in image, and a method of fabricating the same.

In order to solve the above problems, according to an aspect of the present invention, there is provided a back-illuminated photodetector having an imaging portion for outputting charges in response to incidence of an electromagnetic wave or charged particles on a first surface of a thin semiconductor essentially consisting of silicon, the electromagnetic wave or charged particles being transmitted through the thin semiconductor, comprising (1) an insulating film essentially consisting of one of inorganic and organic materials and formed on a surface covering the imaging portion on the first surface, (2) an oxidizable conductive film essentially consisting of one of a semiconductor and a metal and deposited on the insulating film, and (3) a glass substrate anodically bonded on an entire surface of the oxidizable conductive film.

According to this arrangement, the insulating film, the oxidizable conductive film, and the glass substrate are stacked on the imaging portion of the thin semiconductor. The insulating film electrically insulates the conductive film from the imaging portion. The conductive film unifies electrostatic charges generated in the glass substrate. The interface of the conductive film is oxidized by oxygen atoms in the glass substrate to form covalent bonds, so the glass substrate and the conductive film are firmly bonded.

The present invention can particularly suitably be used for an image sensing device that is a one- or two-dimensional array of a plurality of pixels for individually detecting the incident electromagnetic wave or charged particles. With this arrangement, a large image sensing device with a good uniformity in image can be obtained.

A connection terminal region where a connection terminal for connecting the imaging portion to an external circuit is formed is preferably exposed at an end portion on a second surface side opposite to the first surface. With this arrangement, extraction of a detection signal is facilitated.

The connection terminal region is preferably arranged along one or adjacent two sides of the second surface. With this arrangement, when a plurality of devices are to be arranged, the terminal is prevented from being arranged between the devices, so a larger sensing area can be easily obtained.

The imaging portion may comprise a charge coupled device. With this device, an optical image can be easily converted into an image signal.

The insulating film may consist of one of inorganic glass and polyimide resin. With this material, the insulating properties and heat resistance of the insulating film become high.

The conductive film may consist of one of aluminum and polysilicon doped with a conductive impurity. With this arrangement, a conductive film having high electrical conductivity and heat resistance can be obtained.

The thermal expansion coefficient of the glass substrate preferably substantially equals that of the thin semiconductor. With this material, the thermal expansion of the glass substrate and the thin semiconductor on both sides of the imaging portion match each other.

According to another aspect of the present invention, there is provided a method of fabricating a back-illuminated photodetector having, on a semiconductor substrate, an imaging portion for generating charges in response to incidence of an electromagnetic wave or charged particles transmitted through the semiconductor substrate and outputting the charges, comprising the steps of (1) forming the imaging portion on a first surface of the semiconductor substrate essentially consisting of silicon, (2) coating the entire first surface having the charge imaging portion with one of inorganic and organic insulating materials, (3) depositing an oxidizable conductive film essentially consisting of one of a semiconductor and a metal on the entire coating film, (4) anodically bonding a surface of the conductive film to a glass substrate, and (5) grinding the semiconductor substrate from a second surface opposite to the first surface using mechanical polishing, chemical etching, or both of them to thin the semiconductor substrate.

According to this method, the back-illuminated photodetector of the present invention, which is reinforced from the back side of the illuminated surface by the anodically bonded glass substrate and has the thin silicon substrate, can be obtained.

The method may further comprise the step of exposing, of the semiconductor substrate, a connection terminal region for connecting an external circuit to the imaging portion by etching the semiconductor substrate from the second surface. In addition, the method may further comprise the step of implanting ions from the second surface of the thinned semiconductor substrate and performing activation annealing.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
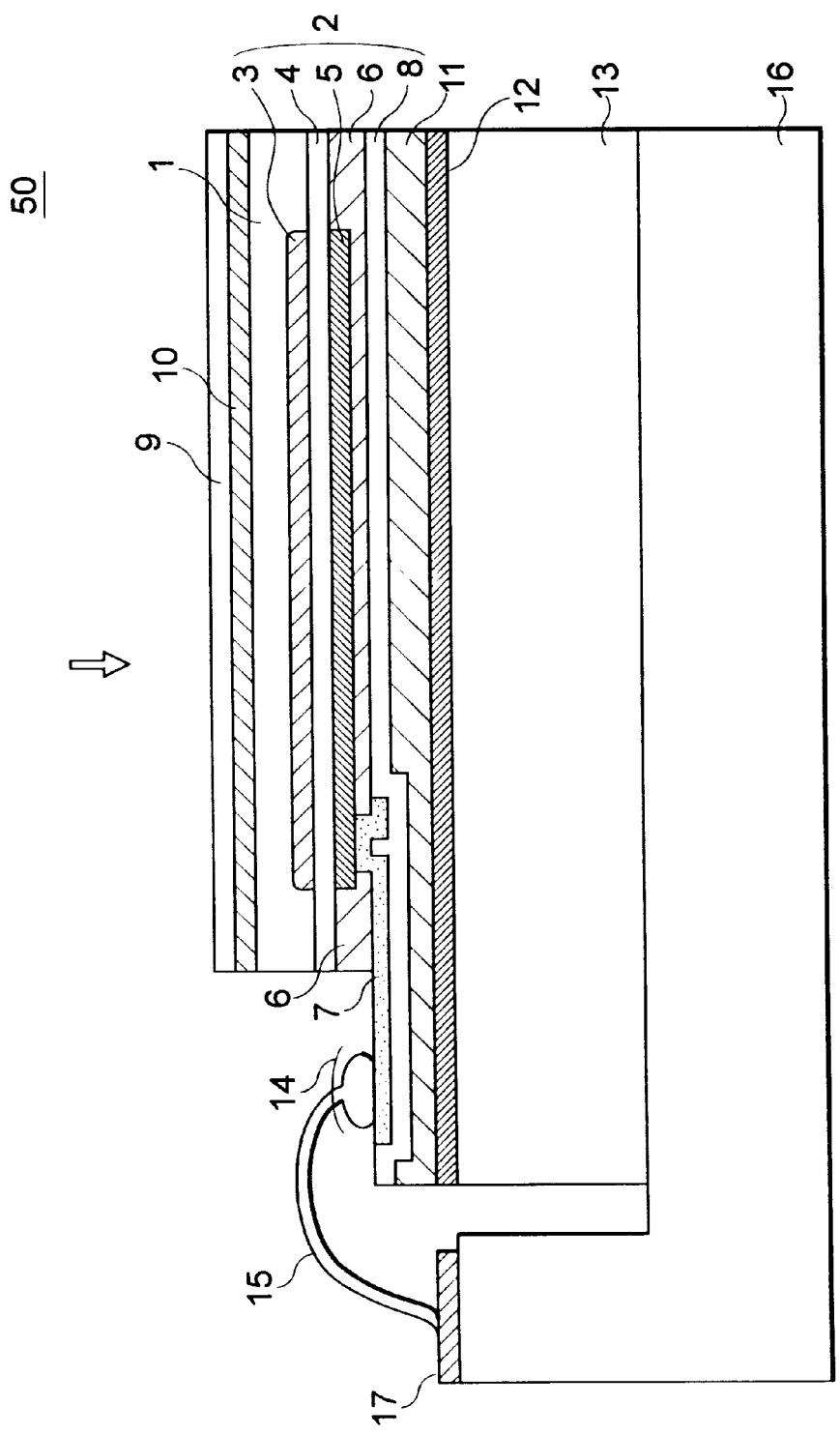
FIG. 1 is a sectional view showing the first embodiment of the present invention.

Embodiments of the present invention will be described below with reference to the accompanying drawings. To facilitate the comprehension of the explanation, the same reference numerals denote the same constituent elements throughout the drawings, and a repeated description will be omitted. The drawings have some exaggerations for the descriptive convenience, and the dimensions and shapes shown in the drawings do not always agree with actual dimensions and shapes.

Figure 2:
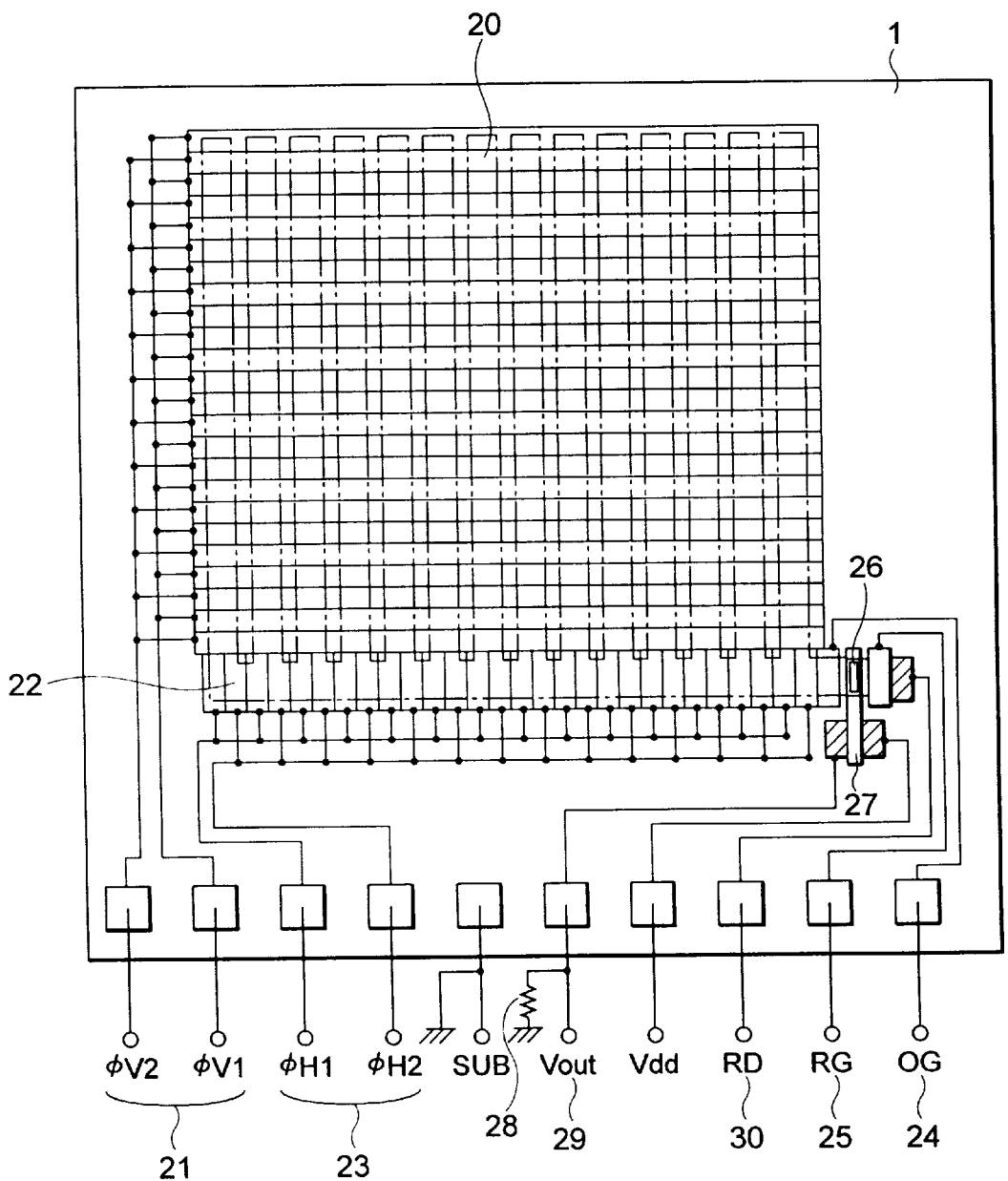
FIG. 2 is a circuit diagram of a CCD of the first embodiment shown in FIG. 1.

FIG. 1 is a sectional view of a back-illuminated photodetector according to an embodiment of the present invention. FIG. 2 is a circuit diagram showing the imaging portion when viewed from a surface opposite to the imaging surface.

The arrangement of this device will be described first with reference to FIGS. 1 and 2.

As shown in FIG. 1, a protective silicon oxide film 9 having a thickness of about 0.1 $\mu$m is formed on the illuminated surface side on which light or an electromagnetic wave is incident. A p$^+$-type accumulation layer 10 having a thickness of about 0.2 $\mu$m and an impurity concentration of about $5\times10^{18}$ cm$^{-3}$ is formed inside the silicon oxide film 9 so that charges photoelectrically generated are sent to a side opposite to the illuminated surface. The accumulation layer 10 is formed on a (100) p-type silicon substrate 1 having a thickness of about 10 to 30 $\mu$m and a resistivity of about 10 to 100 $\Omega\cdot$cm. A CCD 2 for is formed on a surface of the silicon substrate 1 on the opposite side (lower side in FIG. 1) of the illuminated surface.

The structure of the CCD 2 will be described. An n-type buried channel 3, a silicon oxide film 4, a poly-Si transfer electrode 5, and a phospho-silicate glass (PSG) film 6 as an insulating interlayer are stacked on the silicon substrate 1 in the order named. An aluminum interconnection 7 electrically connected to the transfer electrode group 5 to extract a signal is formed on the PSG film 6 at one end. The aluminum interconnection 7 portion projects along one side of the silicon substrate 1 so that the surface of the aluminum interconnection 7 is exposed to the illuminated surface side. An electrode pad 14 is formed on the exposed surface. Surfaces of the PSG film 6 and the aluminum interconnection 7 opposite to the illuminated surface are covered with a protective silicon nitride film 8.

An insulating polyimide film 11 having a thickness of about 3 μm and a planarized surface on the opposite side of the illuminated surface and an aluminum film 12 having a uniform thickness of about 1 μm are stacked on the surface of the CCD 2 opposite to the illuminated surface. The aluminum film 12 is anodically bonded on a Pyrex glass substrate 13 about 1 mm thick. The glass substrate 13 is fixed on a ceramic substrate 16.

The ceramic substrate 16 has a portion projecting to the illuminated surface side. An metal pattern 17 for extracting a signal is formed on the surface of the projecting portion. The metal pattern 17 is wire-bonded to the electrode pad 14 with a gold wire 15.

The circuit arrangement of the CCD 2 will be described next with reference to FIG. 2. The CCD 2 of this embodiment uses the FFT scheme. A number of pixels (e.g., 512 pixels in the horizontal direction and 1,024 pixels in the vertical direction) each having a size of about 50 μm×50 μm are two-dimensionally arrayed on the silicon substrate 1. Each line of pixels arrayed in the vertical direction constitutes a vertical transfer channel 20. A vertical transfer electrode group 21 is connected in a direction perpendicular to the vertical transfer channels 20, thereby forming a vertical shift register. On the other hand, the vertical transfer channels 20 are connected to horizontal transfer channels 22. A horizontal transfer electrode group 23 is connected in a direction perpendicular to the horizontal transfer channels 22, thereby forming a horizontal shift register.

An output gate (OG) 24 held at a predetermined potential is connected to the horizontal shift register. A reset gate (RG) 25 is connected to the OG 24 through a floating diode 26. A field effect transistor (FET) 27 is connected to the floating diode 26. This FET 27 is grounded through an external load resistor 28 to form a source follower circuit. A branch of the FET 27, which is different from the load resistor 28, is connected to an output terminal 29. The FET 27 is also connected to a reset drain (RD) 30.

Figure 3:
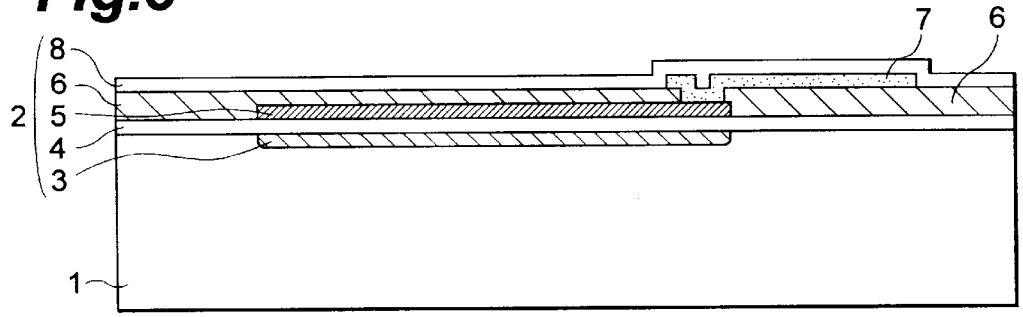
FIGS. 3 to 9 are sectional views showing the fabricating process of the embodiment shown in FIG. 1.

The fabricating process of this embodiment will be described below with reference to FIGS. 3 to 9. FIGS. 3 to 9 are sectional views showing the fabricating process of this embodiment. As shown in FIG. 3, a CCD 2 is formed on that surface of a silicon substrate 1 about 300 μm thick, which is opposite to the illuminated surface. For this CCD 2, an n-type buried channel 3, a silicon oxide film 4, a transfer electrode 5, and a PSG film 6 are stacked, an aluminum interconnection 7 connected to the transfer electrode 5 is formed on the PSG film 6, and a silicon nitride film 8 is formed on the entire surface, as described above.

Figure 4:
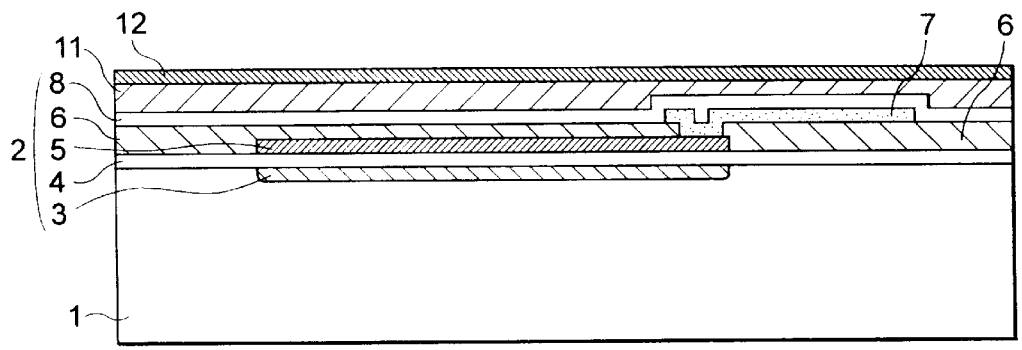

A polyimide film 11 and an aluminum film 12 are formed on the silicon nitride film 8 of the CCD 2, as shown in FIG. 4. A polyimide resin is applied to the silicon nitride film 8 to a thickness of about 3 μm. A flat surface without any unevenness on the polyimide resin can be obtained. The entire structure is fired at about 420° C. to set the resin on the silicon nitride film 8, thereby obtaining a polyimide film 11. An aluminum film 12 about 1 μm thick is deposited on the polyimide film 11 by sputtering.

Figure 5:
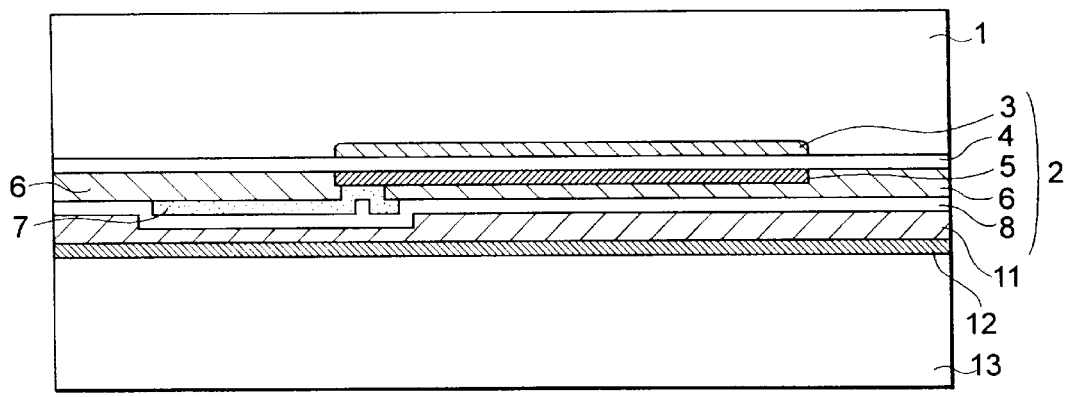

As shown in FIG. 5, the aluminum film 12 is bonded to the planarized surface of a glass substrate 13. The two members are bonded using so-called anodic bonding in which the aluminum film 12 and the Pyrex glass substrate 13 (Corning #7740) about 1 mm thick are bonded at about 400° C. while applying a high voltage to the aluminum film 12 and the glass substrate 13. As a result, the interface of aluminum film 12 oxidizes in the presence of oxygen atoms in the glass substrate 13. The aluminum film 12 shares oxygen atoms with the glass substrate 13 to form covalent bonds. For this reason, the silicon substrate 1 having the CCD 2 and the glass substrate 13 are firmly bonded via the aluminum film 12. In addition, as described above, since the surfaces of the aluminum film 12 and the glass substrate 13 are planarized, voids due to air confinement in the interface can be prevented from forming, so a poor uniformity in image due to void formation can be prevented. The thermal expansion coefficient of the glass substrate 13 is $3.4\times10^{-6}$ and is considerably close to that of the silicon substrate 1, i.e., $4\times10^{-6}$. For this reason, warping or distortion due to the difference in thermal expansion coefficient between the silicon substrate 1 and the glass substrate 13 can be prevented.

Figure 6:
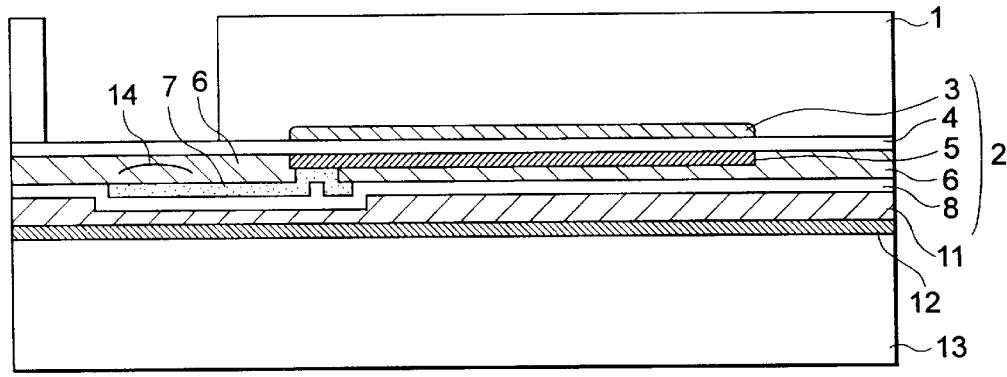

After this, the silicon substrate 1 is removed at a position corresponding to the electrode pad 14 of the CCD 2 by etching, as shown in FIG. 6. This process is performed in the following manner. A silicon nitride film (not shown) is deposited on the silicon substrate 1 and patterned into a desired shape by so-called photolithography. Etching is performed using an alkali solution such as KOH to remove the silicon portion while leaving a thick portion covered with the silicon nitride film. Etching is ended when the silicon oxide film 4 is exposed.

Figure 7:
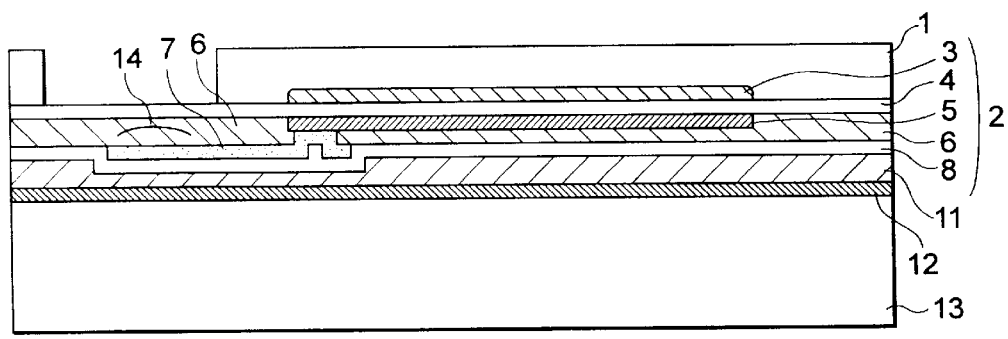

As shown in FIG. 7, the silicon substrate 1 is thinned to a desired thickness of about 10 to 30 μm. For this process, mechanical polishing, chemical etching, or both methods can be used. The thin silicon substrate 1 is reinforced from the back side by the firmly bonded glass substrate 13, so the mechanical strength is kept high as a whole. In addition, handling in this process is also facilitated.

Figure 8:
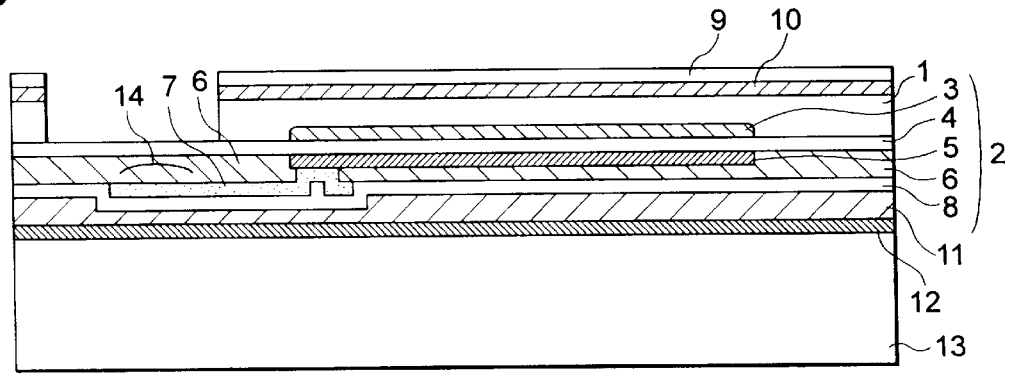

As shown in FIG. 8, the oxide film 9 is vacuum-deposited on the illuminated surface of the silicon substrate 1 to a thickness of about 0.1 μm. Boron ions are implanted from the surface of the oxide film 9 at about $1\times10^{14}$ to $1\times10^{15}$/cm$^2$, and annealing is performed at about 400° C. With this process, the p$^+$-type accumulation layer 10 is formed immediately under the oxide film 9. As described above, since the silicon substrate 1 is reinforced by the glass substrate 13 to keep the mechanical strength, the silicon substrate 1 is not damaged in this process and can be easily handled. Since the silicon substrate 1 and the glass substrate 13 are bonded via the polyimide film 11 and the aluminum film 12, which consist of materials with a high heat resistance, annealing at a higher temperature than that in use of an epoxy resin having a low heat resistance can be performed. Therefore, a high-quality accumulation layer 10 can be stably formed.

This process is preferably performed immediately after thinning the silicon substrate 1. Then, the clean surface of the silicon substrate 1 obtained by thinning can be used as an imaging surface. If processing other than formation of the oxide film 9 is performed after thinning, the silicon substrate 1 may be contaminated with impurities or its surface may roughen during the processing. This makes the interface states unstable to increase the dark current.

Figure 9:
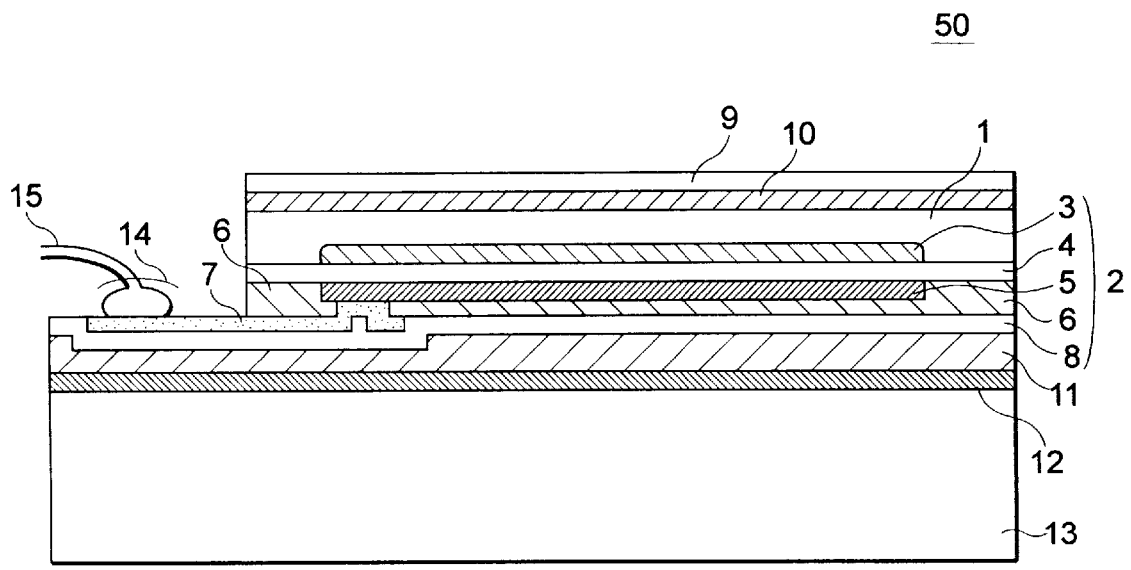

Finally, as shown in FIG. 9, a process of connecting a signal line for extracting the output signal from the CCD 2 is performed. First, the oxide film 4 and PSG film 6 left on the electrode pad 14 are removed by etching to expose the electrode pad 14. The entire device is cut off in the stacking direction at the outermost peripheral portion of the exposed electrode pad 14, and the device is fixed on a substrate 16 (FIG. 1). After this, the electrode pad 14 and the metal pattern 17 (FIG. 1) formed on the substrate 16 are connected by ball bonding using a gold wire 15. Since the electrode pad 14 is reinforced from the back side by the glass substrate 13, bonding can be reliably and easily performed. In addition, since the device maintains its mechanical strength, the electrode pad 14 can be arranged along one of the four sides of the device chip. With this arrangement, the edges of the remaining three sides can be made close to the outer periphery of the device. When devices having an identical shape are arrayed in contact with each other, the imaging portions can be arranged with almost no gaps, so the total size of the imaging portion can be easily increased.

Since a resultant device 50 is reinforced from the surface opposite to the illuminated surface by the glass substrate 13, the mechanical strength is maintained high. In addition, since the thermal expansion coefficient of the glass substrate 13 matches that of the silicon substrate 1 of the CCD 2, warping or distortion due to heat is prevented.

Figure 10:
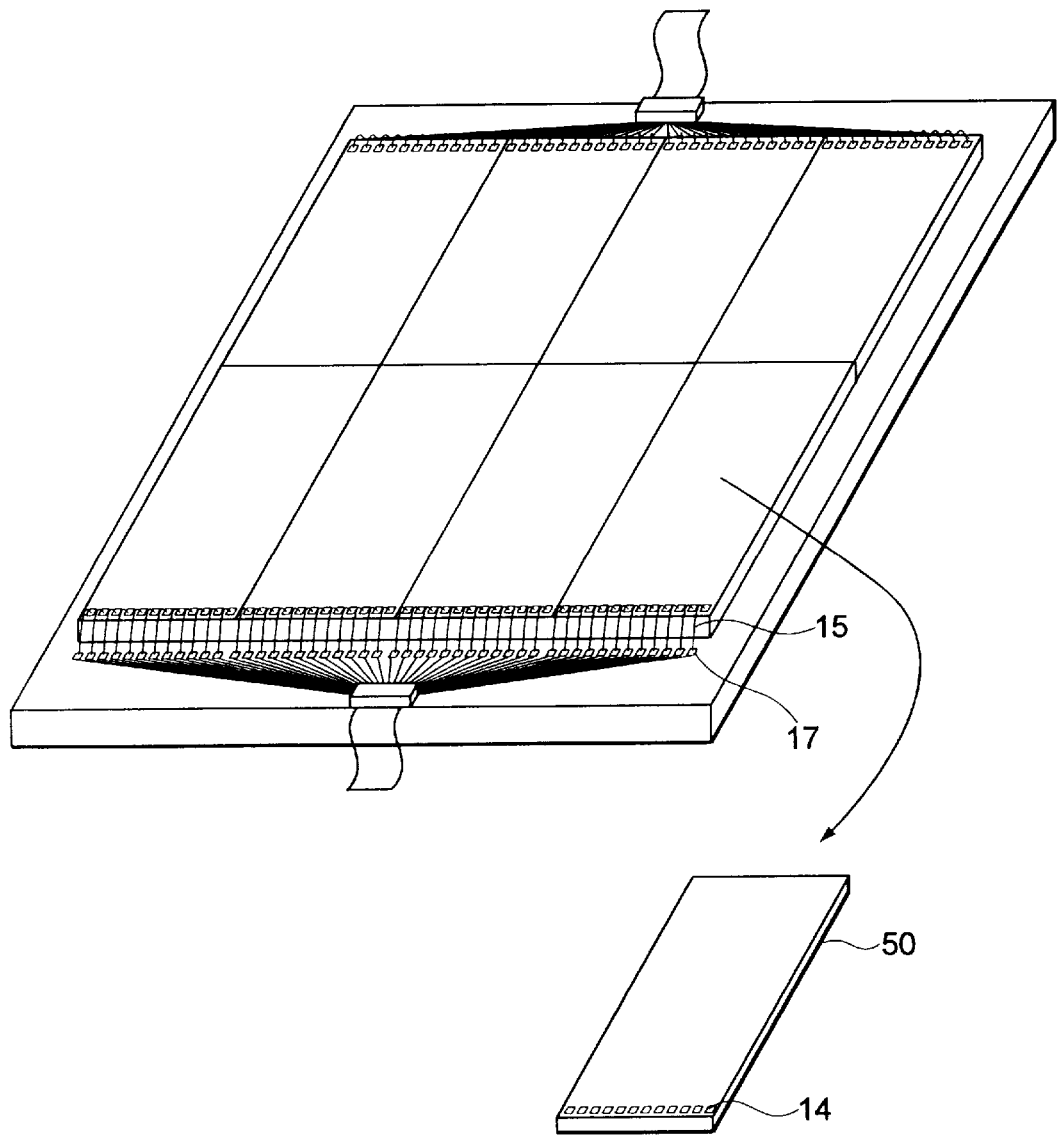
FIG. 10 is a perspective view showing the use form in the embodiment shown in FIG. 1.

The operation of this embodiment will be described next. When a plurality of, e.g., 4×2=8 devices 50 of this embodiment are arranged and used, as shown in FIG. 10, the illuminated surface can be made large. As described above, the electrode pad 14 is arranged along one side of the device 50. When the remaining three sides are placed in contact with other devices 50 to array the imaging portions without gaps, a large-size imaging portion can be formed.

When short-wavelength light (electromagnetic wave) such as an X-ray is incident on the devices 50 with the above arrangement, as shown in FIG. 1, the incoming light from the illuminated surface passes through the protective film 9 and is photoelectrically converted in the region from the accumulation layer 10 to the buried channel 3. Generated charges diffuse, reach the potential well of each pixel, and are stored. The accumulation layer 10 lowers the potential near the illuminated surface. Since the charges generated upon photoelectric conversion are stably accumulated in the potential well of each pixel, highly sensitive and stable measurement is allowed. In addition, since the silicon substrate 1 is thin, charges generated upon photoelectric conversion can reach the potential well with minimum recombination. Furthermore, diffusion to adjacent pixels is decreased, so lowering the resolution is prevented.

As for the signal charges, each pixel detection signal is transferred to the source follower circuit constituted by the FET 27 and the load resistor 28 by operating the vertical transfer electrode group 21 and the horizontal transfer electrode group 23 shown in FIG. 2. A voltage signal corresponding to the signal charges is output from the output terminal 29, and the signal charges are removed from the reset drain 30.

The aluminum film 12 also has an effect of stabilizing the rear surface potential of the CCD 2 to stabilize the output from the CCD 2. Light entering from the illuminated surface side and transmitted through the imaging portion without being photoelectrically converted is reflected by the aluminum film 12. Since the light passes through the imaging portion again and is photoelectrically converted, the detection efficiency is increased. In addition, the aluminum film 12 shuts the light coming from the glass substrate 13 side.

Figure 11:
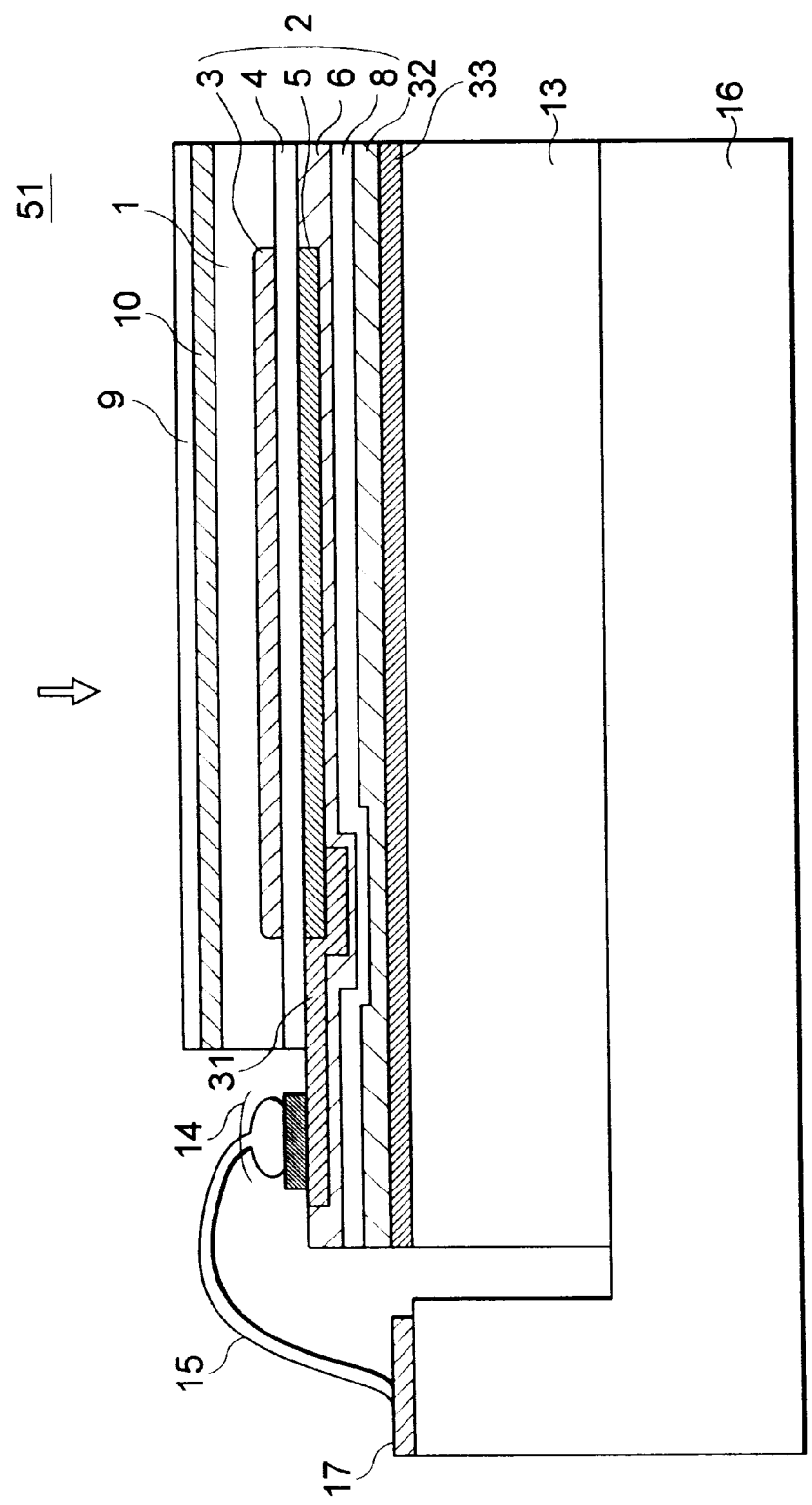
FIG. 11 is a sectional view showing the second embodiment of the present invention.

Another embodiment of the present invention will be described next with reference to FIG. 11. FIG. 11 is a sectional view of the second embodiment. A description of the same portions as in the first embodiment will be omitted and only different portions will be described.

A photosensitive device 51 of the second embodiment uses a polysilicon interconnection 31, an inorganic glass film 32, and a polysilicon film 33 in place of the aluminum interconnection 7, the polyimide film 11, and the aluminum film 12 of the CCD 2 of the embodiment shown in FIG. 1, respectively.

Figure 12:
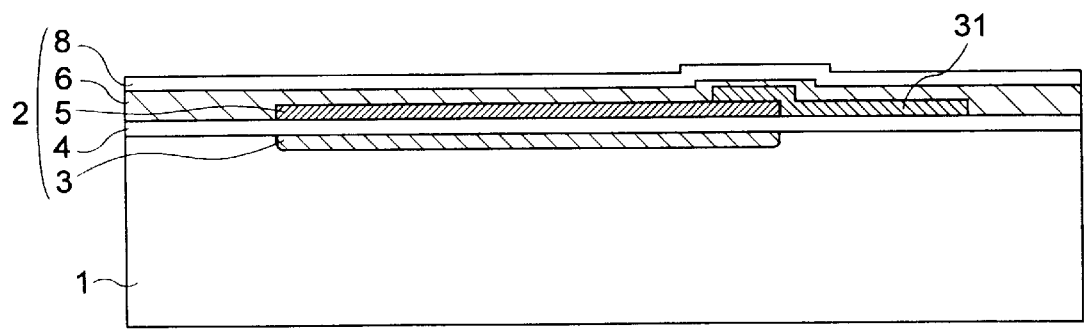
FIGS. 12 to 18 are sectional views showing the fabricating process of the embodiment shown in FIG. 11.

The fabricating process of the second embodiment will be described with reference to FIGS. 12 to 18. FIGS. 12 to 18 are sectional views showing the fabricating process of this embodiment. As shown in FIG. 12, a CCD 2 is formed on that surface of a silicon substrate 1 about 300 $\mu$m thick, which is opposite to the illuminated surface. In this CCD 2, as described above, an n-type buried channel 3, a silicon oxide film 4, a transfer electrode 5, and a PSG film 6 are stacked, a polysilicon interconnection 31 connected to the transfer electrode 5 is formed on the PSG film 6, and a silicon nitride film 8 is formed on the entire surface.

Figure 13:
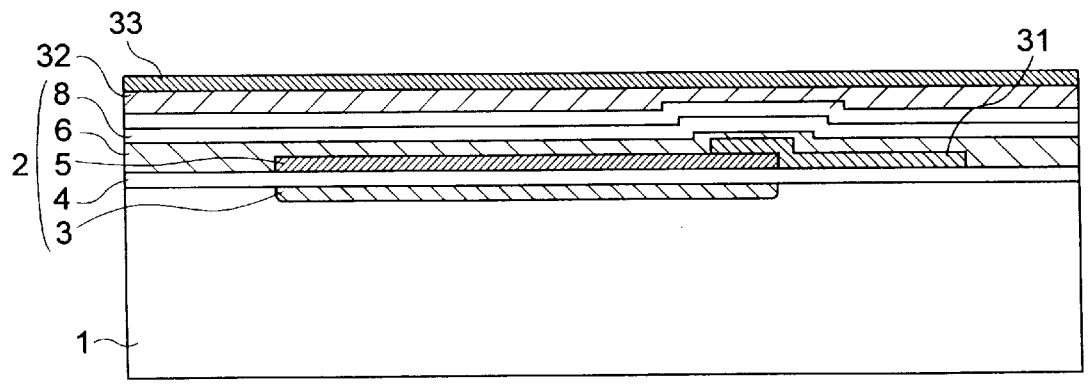

As shown in FIG. 13, an inorganic glass film 32 and a polysilicon film 33 are formed on the silicon nitride film 8 of the CCD 2. First, a gel-like silicon alkoxide solution is applied to the silicon nitride film 8 while rotating the silicon substrate 1 having the CCD 2. When the solution is applied while rotating the silicon substrate, a flat surface without any unevenness on the silicon alkoxide solution can be obtained. The entire structure is fired at about 1,000° C. to remove alcohol and water contained. in the silicon alkoxide solution, thereby obtaining an inorganic glass film 32 consisting of silica glass. According to this method, a silica glass layer having a uniform thickness can be easily formed at a relatively low temperature. Next, a polysilicon film 33 is deposited on the glass film 32 to a thickness of about 0.5 $\mu$m by LP-CVD or sputtering. Boron ions or the like are implanted into the polysilicon film 33, and annealing is performed. The polysilicon film 33 has a nearly uniform thickness and a planarized surface.

Figure 14:
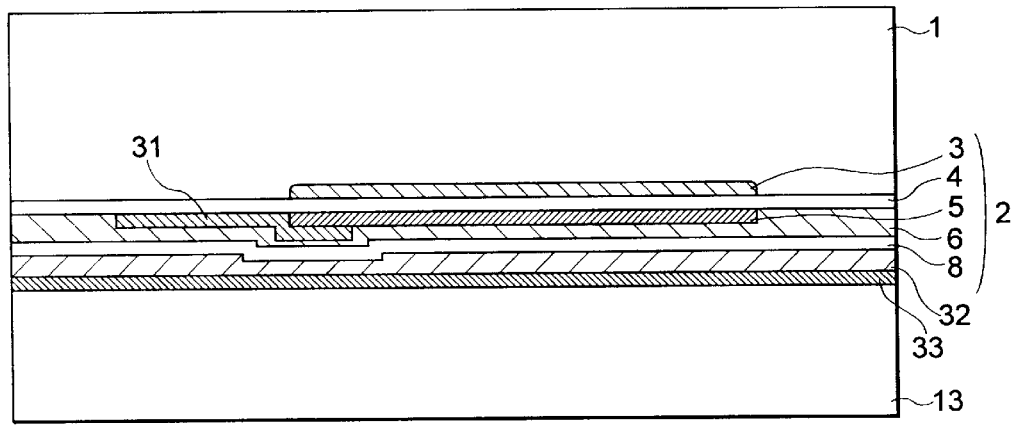

As shown in FIG. 14, a Pyrex glass plate (Corning #7740) having a thickness of about 0.5 to 1 mm is anodically bonded to the surface of the polysilicon film 33 at about 400° C. to attach a glass substrate 13 serving as a reinforcing plate. The polysilicon film 33 oxidizes in the presence of oxygen atoms in the glass substrate 13 to form covalent bonds so the polysilicon film 33 and the glass substrate 13 are firmly bonded.

Figure 15:
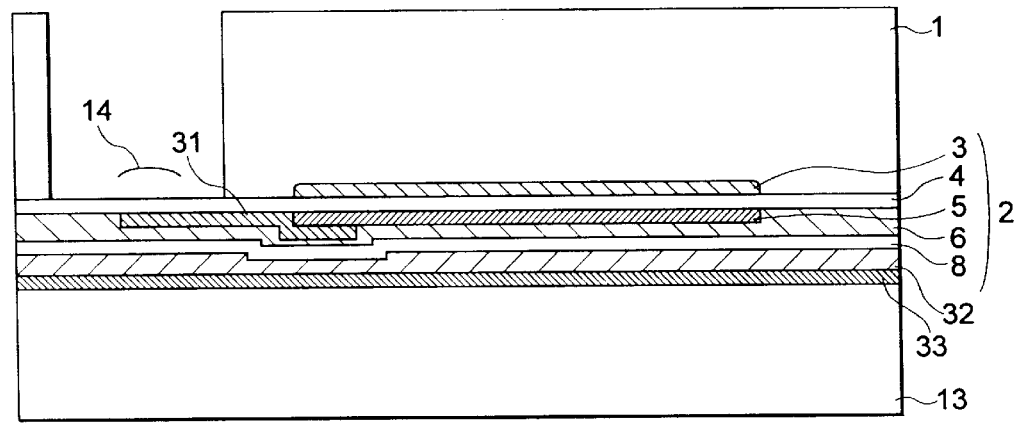
Figure 16:
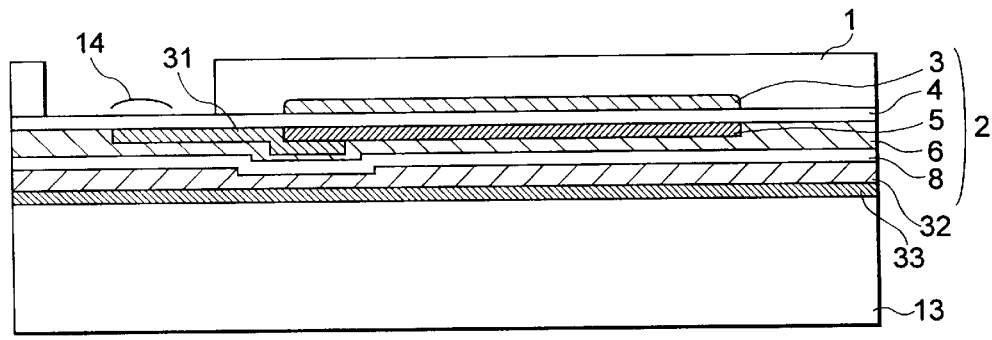

After this, the silicon substrate 1 is removed at a position corresponding to an electrode pad 14 of the CCD 2 by etching, as shown in FIG. 15. The silicon substrate 1 is thinned to a desired thickness of about 10 to 30 $\mu$m, as shown in FIG. 16. These processes are the same as those of the first embodiment shown in FIGS. 6 and 7.

Figure 17:
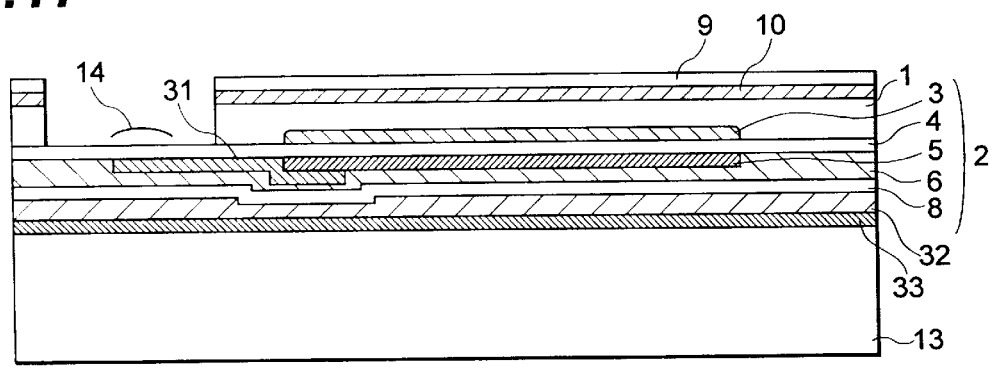

Subsequently, as shown in FIG. 17, an oxide film 9 having a thickness of about 0.1 $\mu$m is formed on the illuminated surface of the silicon substrate 1 by thermal oxidation at about 900° C. Boron ions are implanted from the surface of the oxide film 9 at about $1\times10^{14}$ to $1\times10^{15}/cm^2$, and annealing is performed at about 900° C., thereby forming a $p^+$-type accumulation layer 10 under the oxide film 9. The glass substrate 13 bonded via the inorganic glass film 32 and the polysilicon film 33 has a high heat resistance and can be annealed at a high temperature. For this reason, a high-quality accumulation layer 10 can be stably formed.

Figure 18:
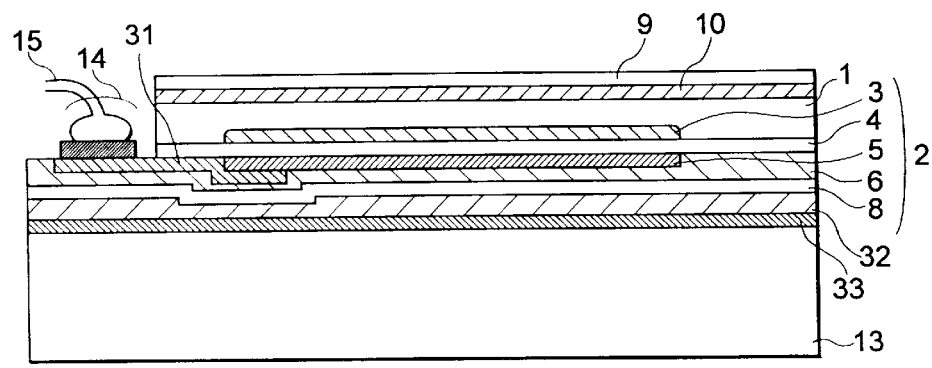

Finally, as shown in FIG. 18, a process of connecting a signal line for extracting the output signal from the CCD 2 is performed. First, the oxide film 4 left at a position where the electrode pad 14 is to be formed is removed by etching to expose the polysilicon interconnection 31 at the position where the electrode pad 14 is to be formed. Next, an electrode pad 14 is formed on the exposed polysilicon interconnection 31 by vacuum-depositing and patterning an aluminum film. The entire device is cut off in the stacking direction at the outermost peripheral portion of the electrode pad 14, and the device is fixed on a substrate 16 (FIG. 11). After this, the electrode pad 14 and an interconnection pattern 17 (FIG. 11) formed on the substrate 16 are connected by ball bonding using a gold wire 15. Since the electrode pad 14 is reinforced from the back side by the glass substrate 13, bonding can be reliably and easily performed. In addition, since the device maintains its mechanical strength, the electrode pad 14 can be arranged along one of the four sides of the device chip. With this arrangement, the edges of the remaining three sides can be made close to the outer periphery of the device. When devices having an identical shape are arrayed in contact with each other, the imaging portions can be arranged with almost no gaps, so the size of the imaging portion can be easily increased.

The resultant device 51 can easily obtain firm bonding to the reinforcing plate, so a product with minimum warping or distortion. In addition, since annealing of the oxide film and the accumulation layer can be performed at a higher temperature than that in the first embodiment, a stable accumulation layer can be obtained, resulting in higher sensitivity.

For the conductive film having covalent bonds with the glass substrate, various oxidizable materials can be used. For example, materials to be firmly bonded to the glass substrate 13 by covalent bonds include metals such as aluminum, titanium, and iron-nickel alloy, and polysilicon or silicon oxide doped with an impurity. These materials are conductive and can unify electrostatic charges locally generated in the glass substrate and prevent a variation in image of the CCD. When a metal such as aluminum, titanium, and iron-nickel alloy having high reflectivity for short-wavelength light is used, the film functions as a mirror.

In the examples described above, a CCD is used as an imaging portion. However, the imaging portion is not limited to this, and an APS may be used.

As has been described above, according to the present invention, since the imaging portion side of the low-profile back-illuminated photodetector is reinforced using the glass substrate via the insulating film and the oxidizable conductive film, the conductive film and the glass substrate have covalent bonds, and high mechanical strength is maintained.

According to the method of fabricating the back-illuminated photodetector of the present invention, firm anode bonding can be easily performed. In addition, since annealing is performed after reinforcement, handling of the device during processing is facilitated. Furthermore, a photosensitive device with high sensitivity and resolution can be easily and stably fabricated while maintaining high mechanical strength.

The back-illuminated photodetector of the present invention can be suitably used for an image sensing device for detecting the spatial energy distribution of short-wavelength light including an electromagnetic wave such as an X-ray or a charged particle beam.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A back-illuminated photodetector having an imaging portion for outputting charges in response to incidence of an electromagnetic wave or charged particles on a first surface of a thin semiconductor plate consisting essentially of silicon, the electromagnetic wave or charged particles being transmitted through said thin semiconductor plate, said back-illuminated photodetector comprising:

an insulating film consisting essentially of one of inorganic materials and organic resins which is applied to and formed on a surface covering said imaging portion on said first surface, said insulating film having a planar surface;

an oxidizable conductive film having a uniform thickness consisting essentially of one of a semiconductor and a metal and deposited on said insulating film; and a glass substrate anodically bonded on an entire surface of said oxidizable conductive film.

2. A device according to claim 1, wherein said imaging portion is a one- or two-dimensional array of a plurality of pixels for individually detecting the incident electromagnetic wave or charged particles.

3. A device according to claim 1, wherein a connection terminal region where a connection terminal for connecting said imaging portion to an external circuit is formed is exposed at an end portion on a second surface side opposite to said first surface.

4. A device according to claim 3, wherein said connection terminal region is arranged along one or adjacent two sides of said second surface.

5. A device according to claim 2, wherein said imaging portion comprises a charge coupled device.

6. A device according to claim 1, wherein said insulating film essentially consists of one of inorganic glass and polyimide resin.

7. A device according to claim 1, wherein said conductive film essentially consists of one of aluminum and polysilicon doped with a conductive impurity.

8. A device according to claim 1, wherein a thermal expansion coefficient of said glass substrate substantially equals that of said thin semiconductor plate.

9. A method of fabricating a back-illuminated photodetector having, on a semiconductor substrate, an imaging portion for generating charges in response to incidence of an electromagnetic wave or charged particles transmitted through said semiconductor substrate and outputting the charges, comprising:

forming said imaging portion on a first surface of said semiconductor substrate consisting essentially of silicon;

applying one of insulating inorganic materials and organic resins to said entire first surface having said imaging portion to form a coating film having a planar surface;

depositing an oxidizable conductive film consisting essentially of one of a semiconductor and a metal on said coating film;

anodically bonding, a surface of said conductive film to a glass substrate; and grinding said semiconductor substrate from a second surface opposite to said first surface using mechanical polishing, chemical etching, or both of them to thin said semiconductor substrate.

10. A method according to claim 9, further comprising the step of exposing, of said semiconductor substrate, a connection terminal region for connecting an external circuit to said imaging portion by etching said semiconductor substrate from said second surface.

11. A method according to claim 9, further comprising the step of implanting ions from said second surface of said thinned semiconductor substrate and performing activation annealing.

* * * * *